US009652575B2

(12) United States Patent
Shen

(10) Patent No.: US 9,652,575 B2
(45) Date of Patent: May 16, 2017

(54) FLOORPLAN-OPTIMIZED STACKED IMAGE SENSOR AND ASSOCIATED METHODS

(71) Applicant: OmniVision Technologies, Inc., Santa Clara, CA (US)

(72) Inventor: Jie Shen, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 194 days.

(21) Appl. No.: 14/246,859

(22) Filed: Apr. 7, 2014

(65) Prior Publication Data

US 2015/0288908 A1 Oct. 8, 2015

(51) Int. Cl.
*G06F 17/50* (2006.01)
*H01L 27/146* (2006.01)

(52) U.S. Cl.
CPC ...... *G06F 17/5072* (2013.01); *H01L 27/1464* (2013.01); *H01L 27/14634* (2013.01); *H01L 27/14636* (2013.01)

(58) Field of Classification Search
CPC ............. G06F 17/5072; H01L 27/1464; H01L 27/14636; H01L 27/14634
See application file for complete search history.

(56) References Cited

U.S. PATENT DOCUMENTS

| 7,506,295 | B1 | 3/2009 | Teig | |
|---|---|---|---|---|
| 2010/0276572 | A1* | 11/2010 | Iwabuchi | H01L 27/1464 250/208.1 |
| 2011/0156195 | A1 | 6/2011 | Tivarus et al. | |
| 2011/0248876 | A1* | 10/2011 | Wikner | H03M 1/1023 341/159 |
| 2013/0265066 | A1* | 10/2013 | Hsieh | H04N 17/002 324/750.01 |
| 2013/0293753 | A1* | 11/2013 | Keelan | H04N 5/3745 348/302 |
| 2015/0049561 | A1* | 2/2015 | Shin | G11C 7/06 365/189.011 |

OTHER PUBLICATIONS

Lapedus, M., "3-D Could Stack Deck for IC Makers in Flight to Tame Interconnect," EE Times, Feb. 19, 2007.
Parton, E., et al. "Interdisciplinarity Takes Imagers to a Higher Level," Solid State Technologies, Jan. 2013.
Wilson, A., "Color Camera Cubes," Vision Systems Design, vol. 15, Issue 11, Nov. 2010.

(Continued)

*Primary Examiner* — Mekonnen Dagnew
(74) *Attorney, Agent, or Firm* — Lathrop & Gage LLP

(57) ABSTRACT

A floorplan-optimized stacked image sensor and a method for designing the sensor are disclosed. A sensor layer includes multiple PSAs partitioned into PSA groups. A circuit layer includes multiple analog-to-digital converters each communicatively coupled to a different PSA. Each analog-to-digital converter (ADC) is semi-aligned to the PSA group associated with the PSA to which it is communicatively coupled. The floorplan of ADCs maximizes contiguous global-based space on the circuit layer uninterrupted by an ADC. The resulting circuit layer floorplan has one or more global-based spaces interleaved with one or more local-based spaces containing ADCs.

20 Claims, 10 Drawing Sheets

(56) References Cited

OTHER PUBLICATIONS

Kiyoyama, K., "A Very Low Area ADC for 3-D Stacked CMOS Image Processing System," in Proceedings of 3DIC, 2011.
Lee, K.W., et al., Characterization of Chip-Level Hetero-Integration Technology for High-Speed, Highly Parallel 3D-Stacked Image Processing System, Electron Devices Meeting, IEEE International, 2012.
Sony Corporate Info, News Releases, "Sony Develops Next-Generation Back-Illuminated CMOS Image Sensor Which Embodies the Continuous Evolution of the Camera," Jan. 23, 2012.
SemiConportal, "Sony Introducing Stacked CMOS Sensors and Investing 80 Billion Yen to Boost Image Sensor Business," Aug. 24, 2012.
Sony ISX014 "Diagonal 4.6 mm (Type 1/4) 8.08M-Effective Pixel Stacked CMOS Image Sensor (SOC) With Built-In High-Performance Image-Processing Engine and Camera System Functions," 2013.
Sukegawa, S., et al., "A 1/4-Inch 8M Pixel Back-Illuminated Stacked CMOS Image Sensor," IEEE International Solid State Circuits Conference, 2013.
Kimura, M., et al. "Sony Unveils Laminated CMOS Sensor Using TSVs," Nikkei Technology, Tech & Industry Analysis from Japan/Asia Online, Feb. 22, 2013.
English translation of the 1st Office Action corresponding to Taiwanese Patent Application No. 104110763; dated Mar. 21, 2016; 4 pages.
Notice of allowance, issued Aug. 2, 2016, by Taiwan Intellectual Property Office (IPO), approving the patent "Floorplan-Optimized Stacked Image Sensor and Associated Methods."

\* cited by examiner

FLOORPLAN-OPTIMIZED STACKED IMAGE SENSOR AND ASSOCIATED METHODS

BACKGROUND

The development of imaging systems manufactured with complementary metal-oxide-semiconductor (CMOS) technologies used to fabricate integrated circuits (ICs) has made cameras ubiquitous in high-volume consumer products including mobile computing devices and automotive products.

CMOS image sensors include an image sensor for detecting light and readout circuitry. The image sensor includes a pixel array, where each pixel converts light incident on it to an electrical signal to be read by readout circuitry. Readout circuitry on the circuit layer includes memory, an image signal processor, though-silicon vias (TSVs), and one or more analog-to-digital converters (ADCs).

Varieties of prior-art CMOS image sensors have different numbers of ADCs. Sensors with a sensor-level analog-to-digital (A/D) conversion have one ADC that receives signals from all pixels on the image sensor. Sensors with column-level A/D conversion have a dedicated ADC for each pixel column. Sensors with pixel-level A/D conversion have a dedicated ADC for each individual pixel.

In conventional CMOS image sensors, both the image sensor and the readout circuitry reside on the same layer. In stacked image sensors, the image sensor resides on a sensor layer and readout circuitry resides on a separate circuit layer positioned beneath the sensor layer. By stacking the sensor layer and the circuit layer, manufacturers may mount a given image sensor size on a smaller substrate, or fit a larger image sensor on a given substrate size.

The circuit layer of a stacked image sensor has multiple ADCs that each connects to a different pixel sub-array (PSA) formed of a contiguous subset of pixels of the pixel array of the sensor layer. By having multiple ADCs each dedicated to a respective subset of pixels, this configuration resembles non-stacked sensors with column-level A/D.

SUMMARY OF THE INVENTION

According to one embodiment, a floorplan-optimized stacked image sensor is provided. The floorplan-optimized stacked image sensor includes a sensor layer and a circuit layer. The sensor layer includes a plurality of pixel sub-arrays PSAs that foam a contiguous two-dimensional pixel array. The circuit layer includes a local-based space with a plurality of ADCs interleaved with a contiguous global-based space uninterrupted by an ADC; the ADCs being positioned to maximize each global-based space.

According to another embodiment, a method for optimizing the floorplan of a stacked image sensor is provided. According to the method, a number of PSAs within the pixel array is determined. Each PSA is partitioned into PSA groups that form a two-dimensional array of PSA groups. An uninterrupted and contiguous global-based space emerges by selecting, within each circuit layer region beneath a column of pixel array groups, a number of ADC locations, wherein the number of ADC locations is at least the number PSAs in the column of PSA groups.

DETAILED DESCRIPTION OF THE FIGURES

Herein, the space occupied by ADCs on the circuit layer of a stacked image sensor is referred to as local-based space, as each ADC is associated with a PSA that designates a locality on the pixel array. The remaining regions on the circuit layer may accommodate other circuit elements, such as memory, through-silicon vias (TSVs), and ISPs that are associated with non-local, or global, sensor attributes. Herein, these remaining regions are referred to global-based space, and circuit elements therein are non-ADC circuit elements. A circuit layer floorplan refers to the arrangement of local-based space and global-based space on a circuit layer. An ADC floorplan refers to the arrangement of ADCs on a circuit layer.

An optimized floorplan maximizes contiguous and uninterrupted global-based space of the circuit layer, which increases the maximum footprint non-ADC circuit elements that fit on the circuit layer. A non-optimized floorplan may necessitate limiting the size and/or number of non-ADC circuit elements that fit on the circuit layer, which inhibits performance, or possibly the addition of a second circuit layer, which increases cost.

Figure 1:
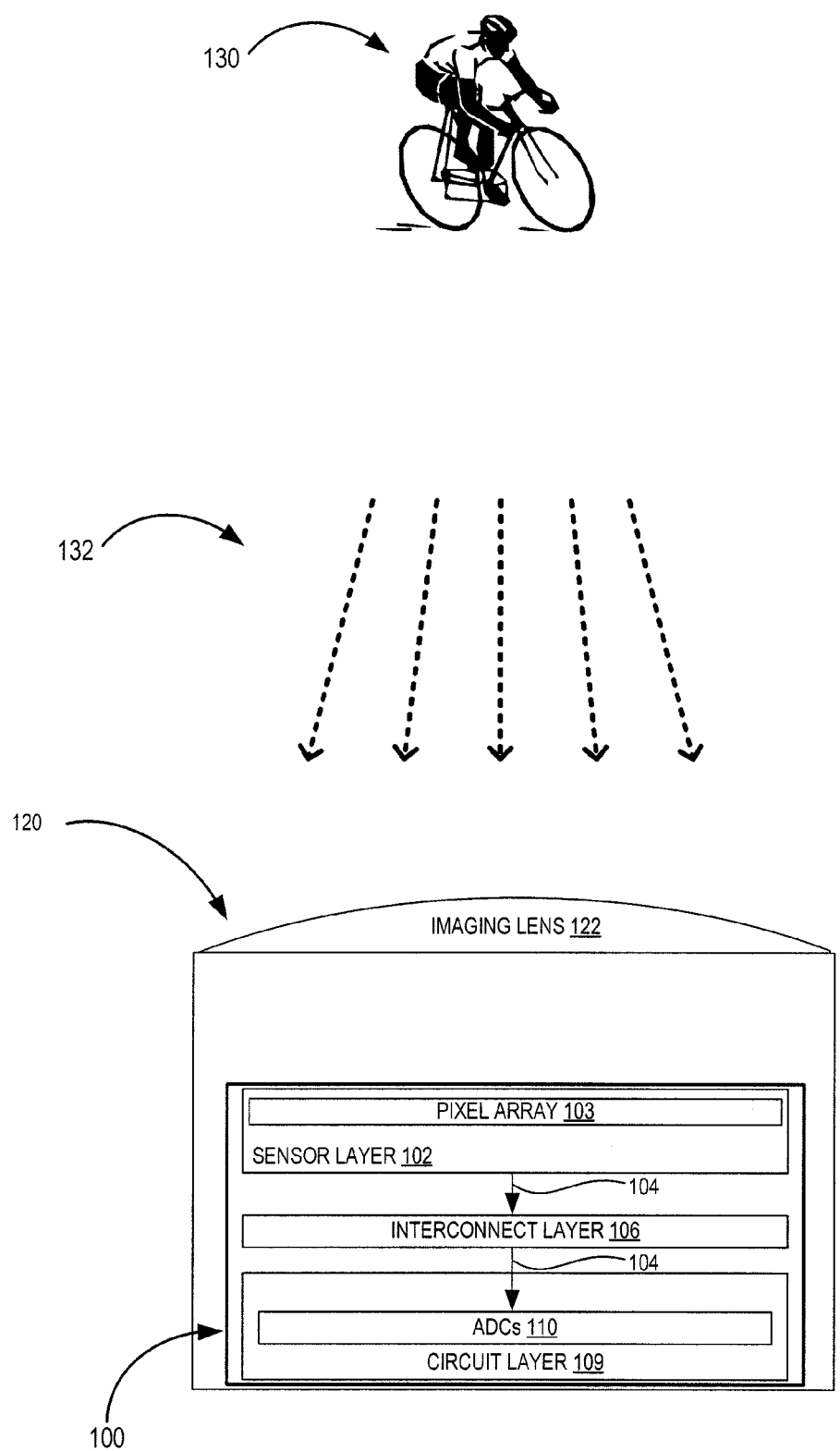
FIG. 1 shows a floorplan-optimized stacked image sensor incorporated into a camera that is imaging an object, in an embodiment.

FIG. 1 shows an exemplary floorplan-optimized stacked image sensor 100 incorporated into camera 120 that is imaging an object 130. Floorplan-optimized stacked image sensor 100 includes sensor layer 102, interconnect layer 106, and circuit layer 109. Sensor layer 102 includes a two-dimensional pixel array 103 that converts incident light 132 into electrical signals 104 that pass through interconnect layer 106 to ADCs 110 arranged on circuit layer 109. Incident light 132 from object 130 is focused by imaging lens 122 onto a pixel array 103 of floorplan-optimized stacked image sensor 100. Sensor layer 102 is, for example, implemented in CMOS, but may be implemented in other technologies without departing from the scope hereof.

Figure 2:
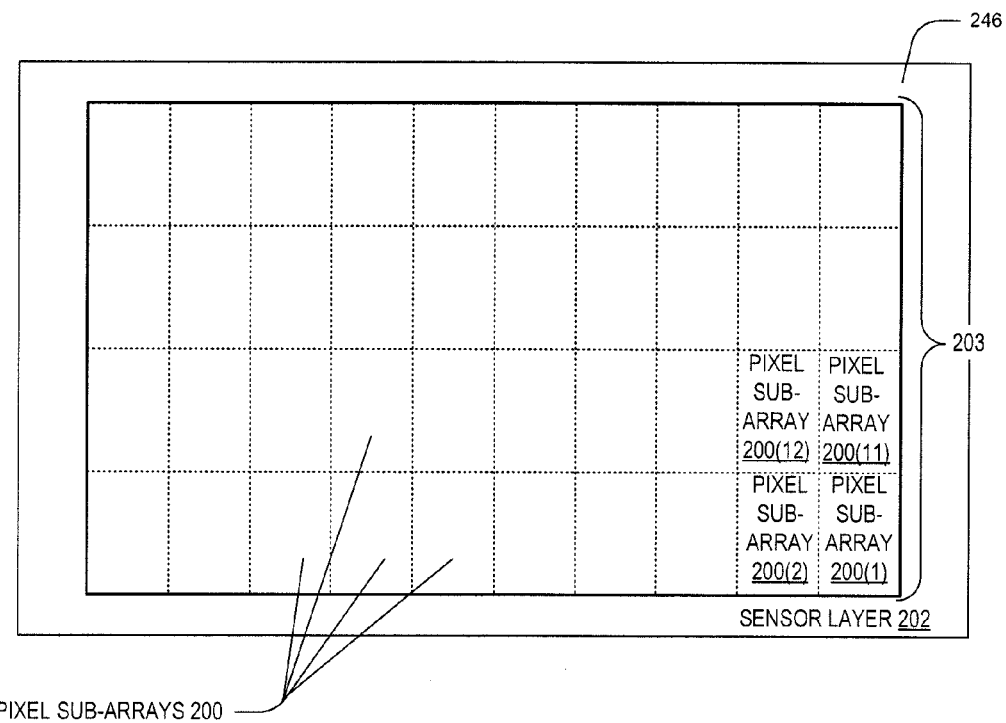
FIG. 2 shows a prior art sensor layer and a corresponding prior art circuit layer.
Figure 2:
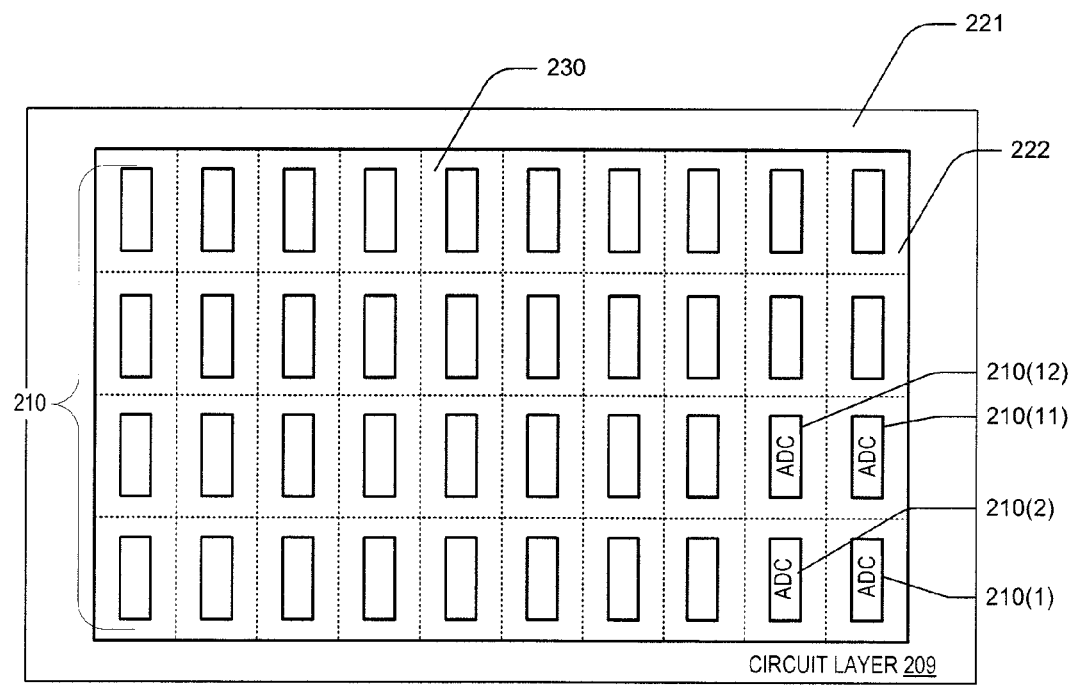
Figure 3:
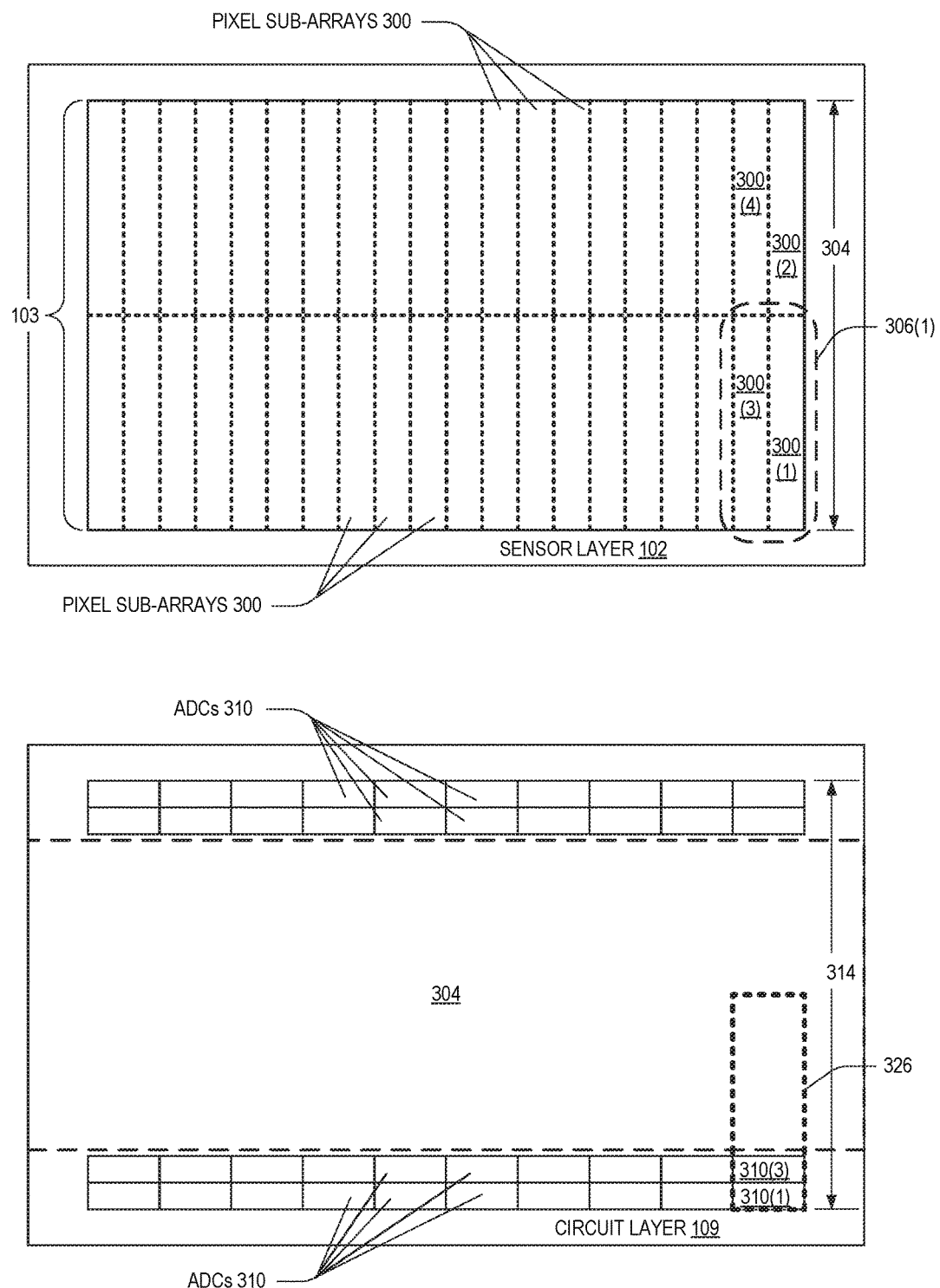
FIG. 3 shows a sensor layer and a corresponding circuit layer of the floorplan-optimized stacked image sensor of FIG. 1, in an embodiment.

For clarity of illustration, the sensor layers and circuit layers shown in FIG. 2 and FIG. 3 have a small number of PSA regions and corresponding ADCs. The number of PSAs and ADCs may be greater than shown without departing from the scope hereof.

FIG. 2 shows a prior art sensor layer 202 and a corresponding prior art circuit layer 209. Sensor layer 202 includes a pixel array 203 that has forty PSAs 200(1-40) arranged in a ten by four array, denoted by dotted lines within pixel array 203.

Circuit layer 209 contains forty ADCs 210 in a ten by four rectangular array, where each ADC 210 is positioned beneath and communicatively couples to a different PSAs 200 of pixel array 203. For example, ADC 210(1) is positioned beneath, and communicatively coupled to, PSA 200(1), ADC 210(2) is positioned beneath, and communicatively coupled to, PSA 200(2), and so on. Each ADC 210 receives and digitizes signals from pixels of its associated PSA 200.

Each ADC 210 occupies an area on circuit layer 209 that is positioned beneath its connected PSA 200. Therefore, circuit layer 209 lacks an area of sufficient contiguous uninterrupted size that is usable for other circuit layer elements, and the area of circuit layer 209 that is not occupied by ADCs 210 is therefore wasted space on circuit layer 209.

FIG. 3 shows sensor layer 102 and circuit layer 109 of floorplan-optimized stacked image sensor 100 of FIG. 1 in further exemplary detail. For clarity, sensor layer 102 and circuit layer 109 are shown unstacked. Pixels of pixel array 103 are grouped into forty PSAs 300, arranged in a two row by twenty column array.

A PSA group 306(i) includes two adjacent PSAs 300. For example, PSA group 306(1) includes PSAs 300(1) and 300(3). Each PSA 300 belongs to only one PSA group (e.g., PSA group 306(1)), such that all PSA groups 306 are distinct and non-overlapping.

Each ADC 310 of circuit layer 109 communicatively couples to a different PSA 300 of sensor layer 102. ADCs 310(1) and 310(3) are each semi-aligned with PSA group 306(1), which includes PSAs 300(1) and 300(3). A circuit layer region 326 represents an area on circuit layer 109 that is congruent to PSA group 306(1) and is positioned thereneath when sensor layer 102 and circuit layer 109 are stacked.

In the example of FIG. 3, ADCs 310 each occupy a similar area of circuit layer 109 as each ADC 210 occupies on circuit layer 209, FIG. 2. However, by selecting the aspect ratio of the PSAs 300 and by positioning each ADC 310 appropriately, a global-based space 304 may be maximized to allow other circuit elements to be included on circuit layer 109. For purposes of comparison with the prior art of FIG. 2, each ADC 310 is rotated by ninety degrees relative to ADCs 210 of FIG. 2.

By selecting a width of PSA 300 to equal one-half a length of ADC 310, and by positioning each ADC 310 such that it is beneath two PSAs 300 and towards one edge of circuit layer 109, global-based space 304 has a maximized contiguous and uninterrupted area, as shown. ADCs 310s are beneath the respective PSAs they are connected, which facilitates low-latency digitization of analog pixel signals.

Alternative Examples

In the following examples, pixel array 103 is a Quad Super Extended Graphics Array (QSXGA) with dimensions 2560 by 2048 pixels. However, floorplan-optimized stacked image sensor 100 may be implemented in other sensor types and sizes without departing from the scope hereof.

In the examples of FIGS. 4-8, each PSA 400 is one pixel wide in the x direction, as indicated by coordinate axes 498, and two hundred fifty-six pixels long in the y direction.

Figure 4:
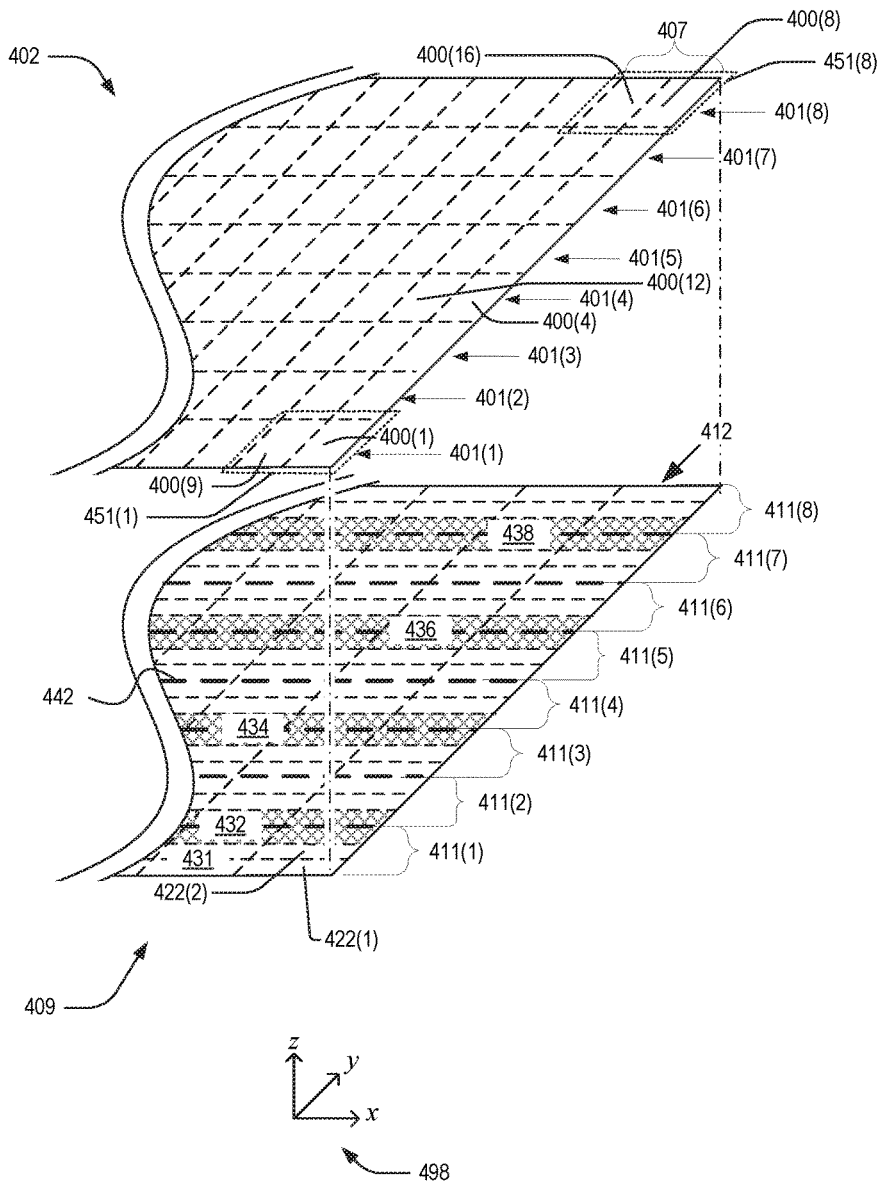
FIG. 4 shows further exemplary detail of a portion of the sensor layer and a corresponding portion of circuit layer of FIG. 1, in an embodiment.

FIG. 4 shows a sensor layer portion 402 of sensor layer 102 of FIG. 1 and a corresponding circuit layer portion 409 of circuit layer 109 in further exemplary detail. PSAs 400(1-16) may be considered a PSA-group column 407 that includes eight PSA groups of two PSAs each. PSA group 451(1) includes PSAs 400(1,9), which are part of PSA row 401(1). PSA group 451(8) includes PSAs 400(8,16), which are part of PSA row 401(8).

Circuit layer portion 409 is beneath sensor layer portion 402. Circuit layer portion 409 is partitioned into circuit-layer columns containing ADCs connected to PSAs 400 in sensor layer portion 402. The width of each column, such as circuit-layer column 412, is two pixel widths.

Positioning of ADCs 422(1) and 422(2) within a circuit layer region 411(1) is similar to the positioning of ADCs 310(1) and 310(3) within circuit layer region 326 of FIG. 3. Along the y direction, the two ADCs are positioned in the lower two-thirds of circuit layer region 411(1). The ADC configuration in circuit layer region 411(2) mirrors that of circuit layer region 411(1), which results in global-based space 432. In one example of circuit layer portion 409, each of the eight circuit layer regions 411 has an equal length of one-eighth that of circuit layer 109. In this example, the length of circuit layer region 431 is two-thirds the length of a circuit layer region 411, or one-twelfth the length of circuit layer 109.

The arrangement of ADCs in circuit layer regions 411(1) and 411(2) is repeated in subsequent circuit layer regions 411(3-8) such that the ADC floor plan of circuit layer portion 409 is symmetric about dashed line 442, which is beneath the boundary of PSA rows 401(4) and 401(5). Global-based spaces 434, 436, and 438 have the same length as global-based space 432.

In the examples presented herein, the ADC floorplan does not vary as a function of x. However, the ADC floorplan may vary as a function of x without departing from the scope hereof.

Figure 5:
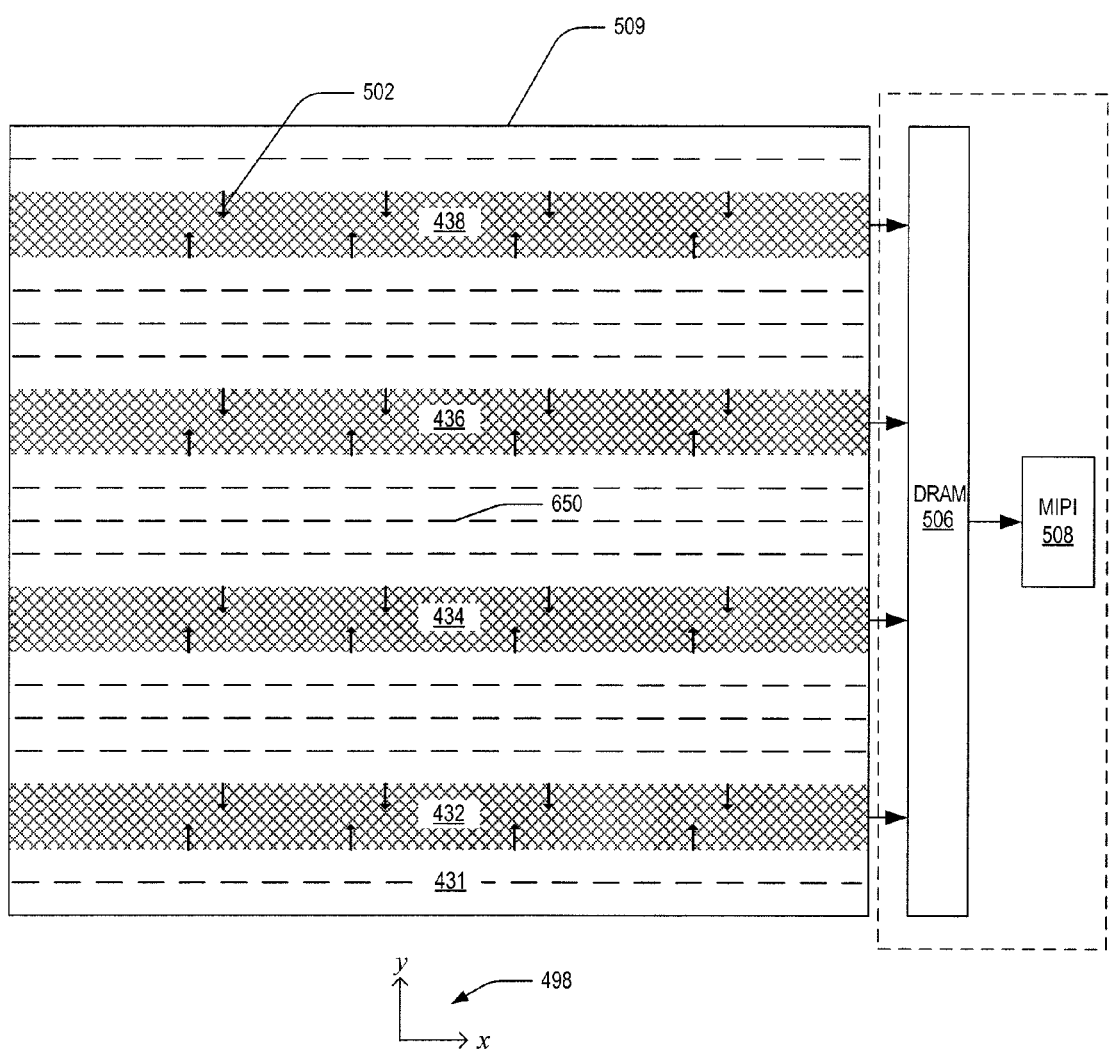
FIG. 5 shows a top view of circuit layer portion of FIG. 4.

FIG. 5 shows a top view of circuit layer 509 configured as shown in circuit layer portion 409. Circuit layer 509 is an example of circuit layer 109, FIG. 1. In FIGS. 5-8, vertically-oriented arrows, such as arrow 502, denote communication between ADCs and circuit elements (not shown) placed in adjacent global-based spaces 432, 434, 436, and 438.

Figure 6:
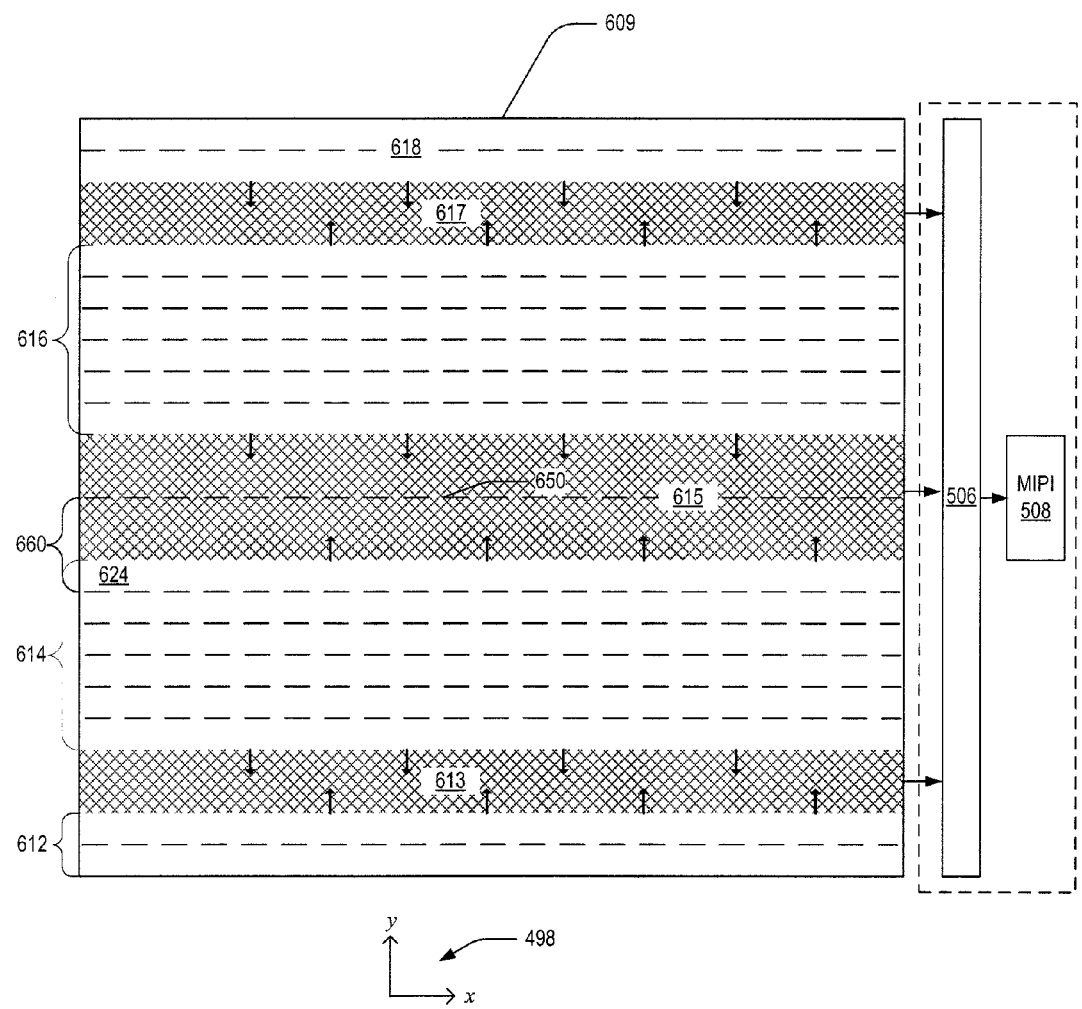
FIG. 6 shows a top view of a circuit layer that has three global-based spaces, in an embodiment.

FIG. 6 shows a top view of a circuit layer 609 that has three global-based spaces 613, 615, and 618. Circuit layer 609 is an example of circuit layer 109, FIG. 1. Central global-based space 615 is larger than global-based spaces 613 and 618. The floorplan of circuit layer 609 is similar to circuit layer 509 of FIG. 5, except that global-based spaces 434 and 436 are translated in the positive y direction and the negative y direction respectively to meet at circuit layer latitude 650. Circuit layer 609 has a wider global-based space in the center than circuit layer 509 of FIG. 5.

Three global-based spaces 613, 615, and 617 are interleaved with local-based spaces 612, 614, 616, and 618 that contain ADCs. In an example of circuit layer 609, the minimum length of a global-based or local-based space is one-third the length of one of the eight PSA rows 401. This minimum length, equal to ¼₄ the length of circuit layer 109, allows for three ADCs to fit beneath a PSA group, such as PSA group 451(1). In this example, the length of each global-based space 613 and 617 is one-twelfth that of circuit layer 109 while the length of global-based space 615 is one-sixth the length of circuit layer 109.

The ADC floorplan of circuit layer 609 results in certain PSA rows 401 containing PSAs each communicatively coupled to an ADC that is not directly beneath the PSA. For example, PSAs in PSA row 401(4) of sensor layer portion 402, FIG. 4, are positioned above the circuit layer region 660, FIG. 6. These PSAs include PSAs 400(4) and 400(12), which are part of PSA-group column 407. The bottom one-third of circuit layer region 660 is ADC row 624, while the remaining top two-thirds is global-based space. The area within circuit layer region 660 beneath PSAs 400(4) and 400(12) hence includes one ADC. If this ADC connects to PSA 400(4), then PSA 400(12) is communicatively coupled with a different ADC that is directly below the PSA-group column 407, but not directly below PSA 400(12). This ADC is therefore considered semi-aligned to a PSA-group column, rather than the PSA it is communicatively coupled to.

Figure 7:
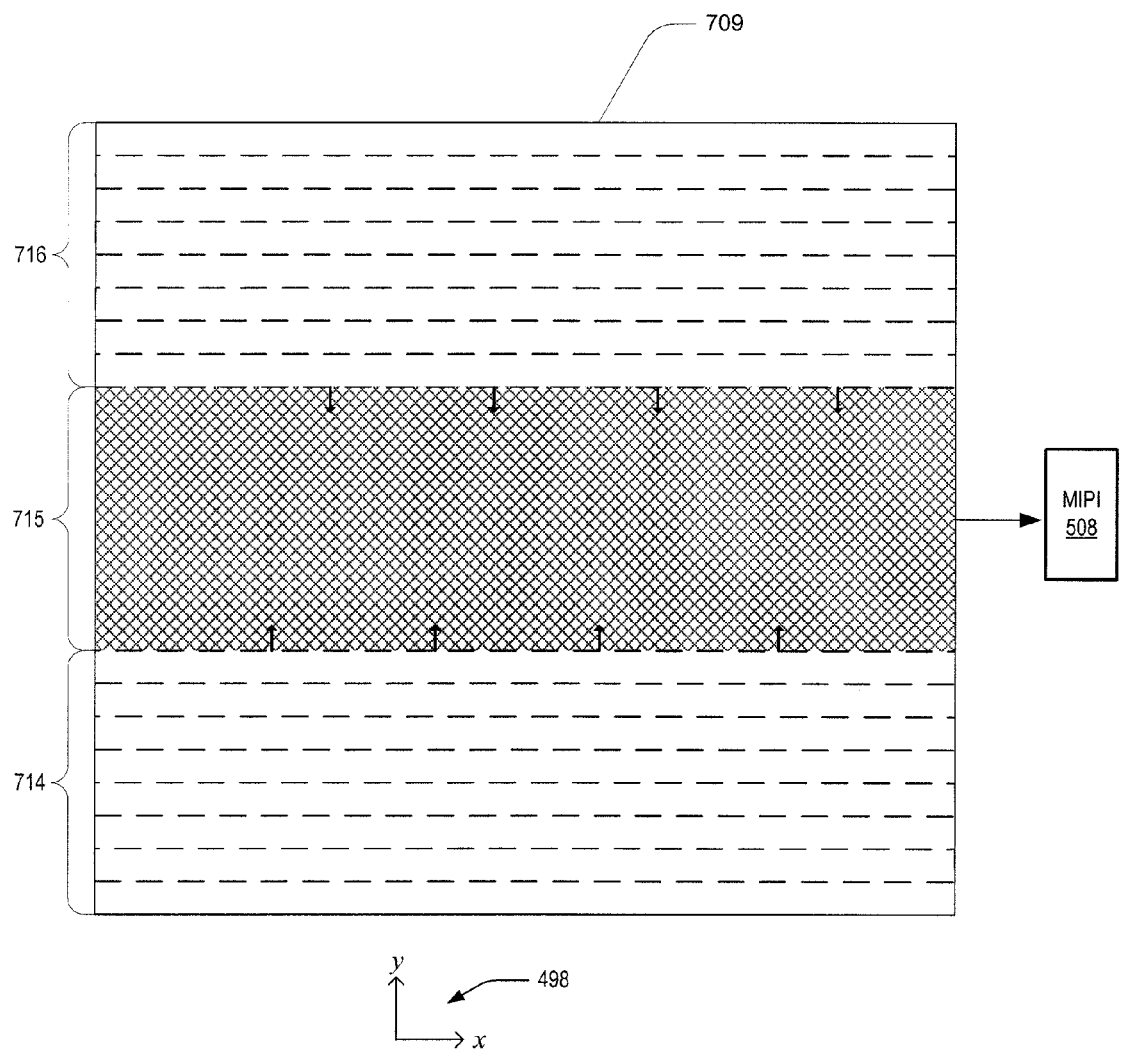
FIG. 7 shows a top view of a circuit layer that has one global-based space centered on the circuit layer and occupying one-third the length of the circuit layer, in an embodiment.

FIG. 7 shows a top view of a circuit layer 709 that has one global-based space 715 centered on the circuit layer and occupying one-third the length of circuit layer 109. Circuit layer 709 is an example of circuit layer 109, FIG. 1. The ADC floorplan of circuit layer 709 is similar to circuit layer 609, except that global-based spaces 617 and 613 are translated in the positive y direction and negative y direction, respectively, until they each meet with global-based space 615. The result is circuit layer 709, which has one global-based space 715.

With the ADC floorplan of circuit layer 709, multiple PSAs are communicatively coupled to ADCs that are not directly beneath them, since global-based space 715 spans more than two full rows of PSAs in the sensor layer portion 402: PSA rows 401(4) and 401(5). PSAs in these rows, such as PSAs 400(4) and 400(5) therefore have no ADCs directly below them. PSAs 400(4) and 400(5) are, for example, connected to ADCs in circuit layer 709 that are beneath the PSA-group column that includes PSAs 400(4) and 400(5): PSA-group column 407. These ADCs are hence semi-aligned to PSA-group column 407.

Figure 8:
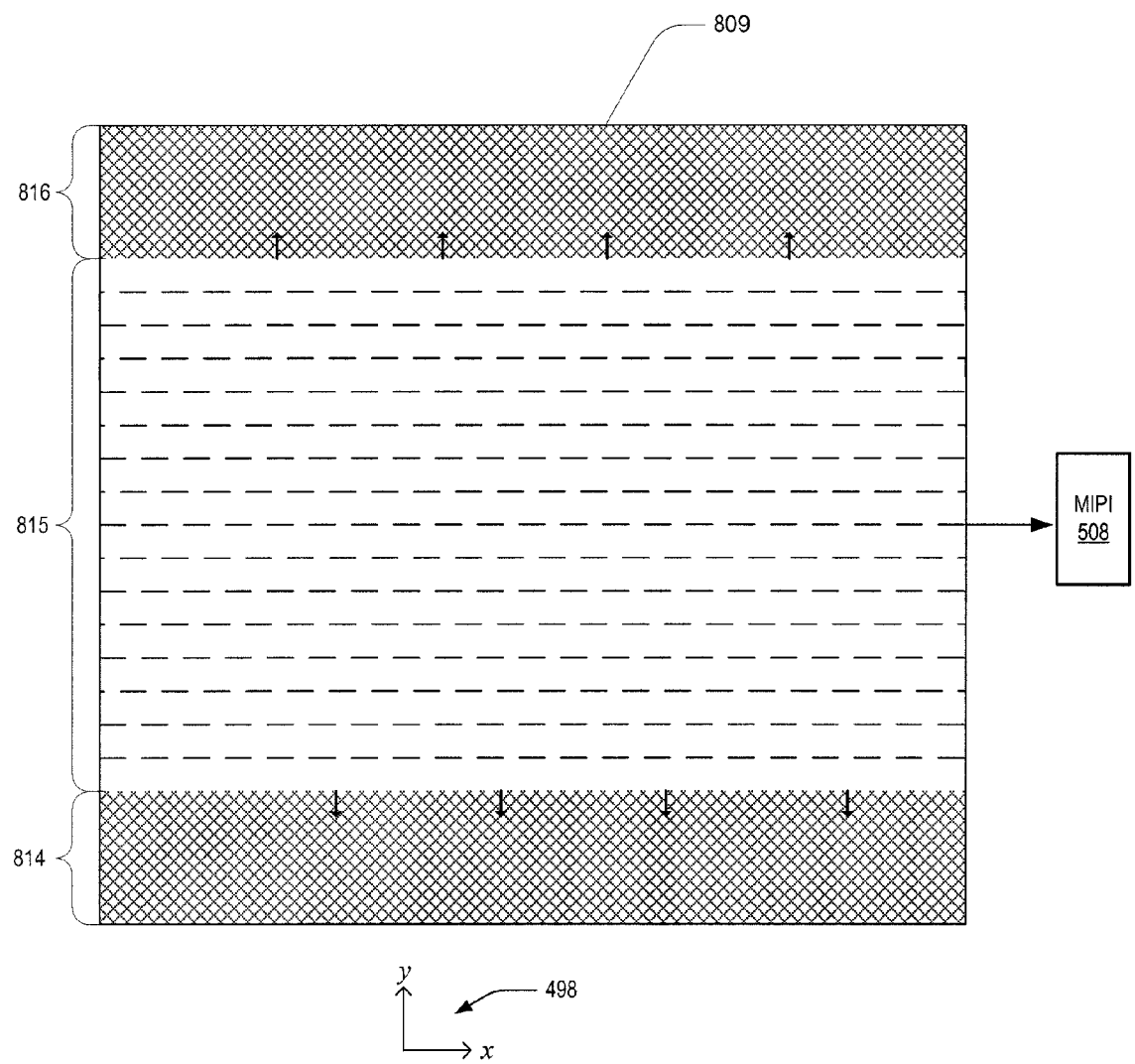
FIG. 8 shows a top view of a circuit layer that has two global-based spaces along the outer edges of the circuit layer, in an embodiment.

FIG. 8 shows a top view of a circuit layer 809 that has two global-based spaces along the outer edges of the circuit layer. Circuit layer 809 is an example of circuit layer 109, FIG. 1. The ADC floorplan of circuit layer 809 is similar to circuit layer 709, except that global-based space 715 is split in half along the x direction, and each half is moved out toward its respective closest circuit layer edge. Along the y direction, with respect to coordinate axes 498, the center two-thirds of circuit layer 809 is occupied by local-based space 815. The global-based spaces 814 and 816 adjacent to local-based space 1015 occupy one-sixth of circuit layer 809.

Global-based spaces 814 and 816 each span more than one full row of PSAs in the sensor layer portion 402, PSA rows 401(1) and 401(8), respectively. PSAs in these rows, such as PSAs 400(1), 400(9), 400(8), 400(16) therefore have no ADCs directly below them, and are connected to ADCs in circuit layer 809 that are beneath PSA-group column 407. These ADCs are hence semi-aligned to PSA-group column 407.

In examples of circuit layers 509, 609, 709, and 809, the non-ADC circuit layer elements may be communicatively coupled to DRAM 506, which is communicatively coupled to an interface 508, as shown in FIG. 5 and FIG. 6. Interface 508 is, for example, an interface that complies with standards set by with the MIPI Alliance trade organization. In an alternative example, DRAM 506 is located in global-based spaces of circuit layers 509, 609, 709, and 809 which are communicatively coupled directly to interface 508, as shown in FIG. 7 and FIG. 8.

Figure 9:
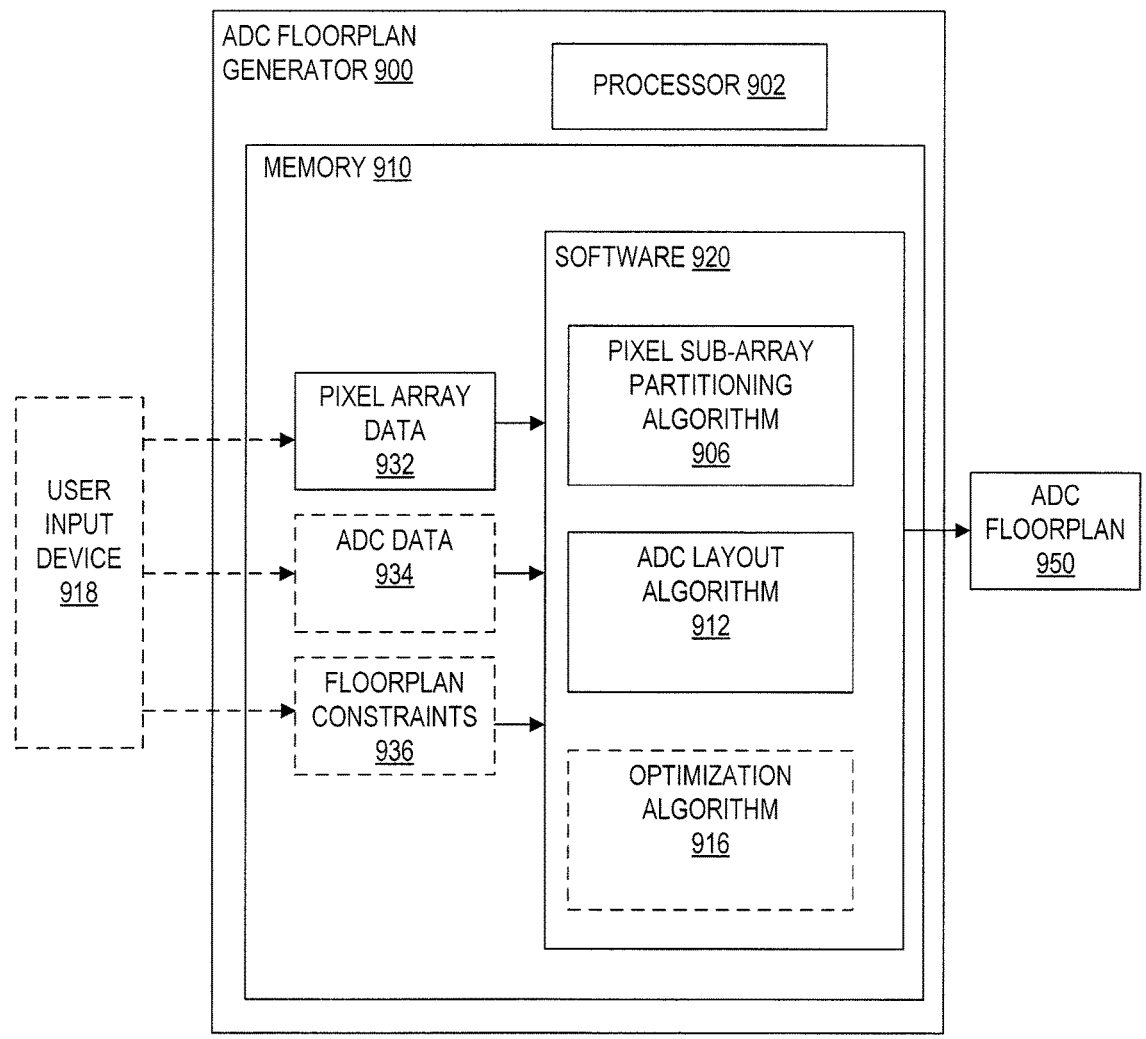
FIG. 9 is a schematic showing one exemplary ADC floorplan generator for generating an arrangement of ADCs on the circuit layer of the floorplan-optimized stacked image sensor of FIG. 1, in an embodiment.

FIG. 9 is a schematic showing one exemplary ADC floorplan generator 900 for generating an arrangement of ADCs 110 on circuit layer 109 of the floorplan-optimized stacked image sensor 100 of FIG. 1. ADC floorplan generator 900 is for example a computer that includes processor 902 and memory 910 storing software 920. Memory 910 represents one or both of volatile and non-volatile memory, as known in the art. Software 920 has machine-readable instructions that are executed by processor 902 to implement the functionality of ADC floorplan generator 900, as described below. Machine-readable instructions include pixel sub-array algorithm 906, ADC layout algorithm 912, and, optionally, optimization algorithm 916.

Memory 910 is shown storing pixel array data 932, which may include the number of PSAs and PSA dimensions. Memory 910 may also store ADC data 934, which may include the physical dimensions of the ADC to be positioned on the circuit layer. Memory 910 may also store floorplan constraints 936. Floorplan constraints 936 include, for example, the maximum number of adjacent ADCs beneath a PSA column and the number of contiguous global-based spaces on the circuit layer.

Figure 10:
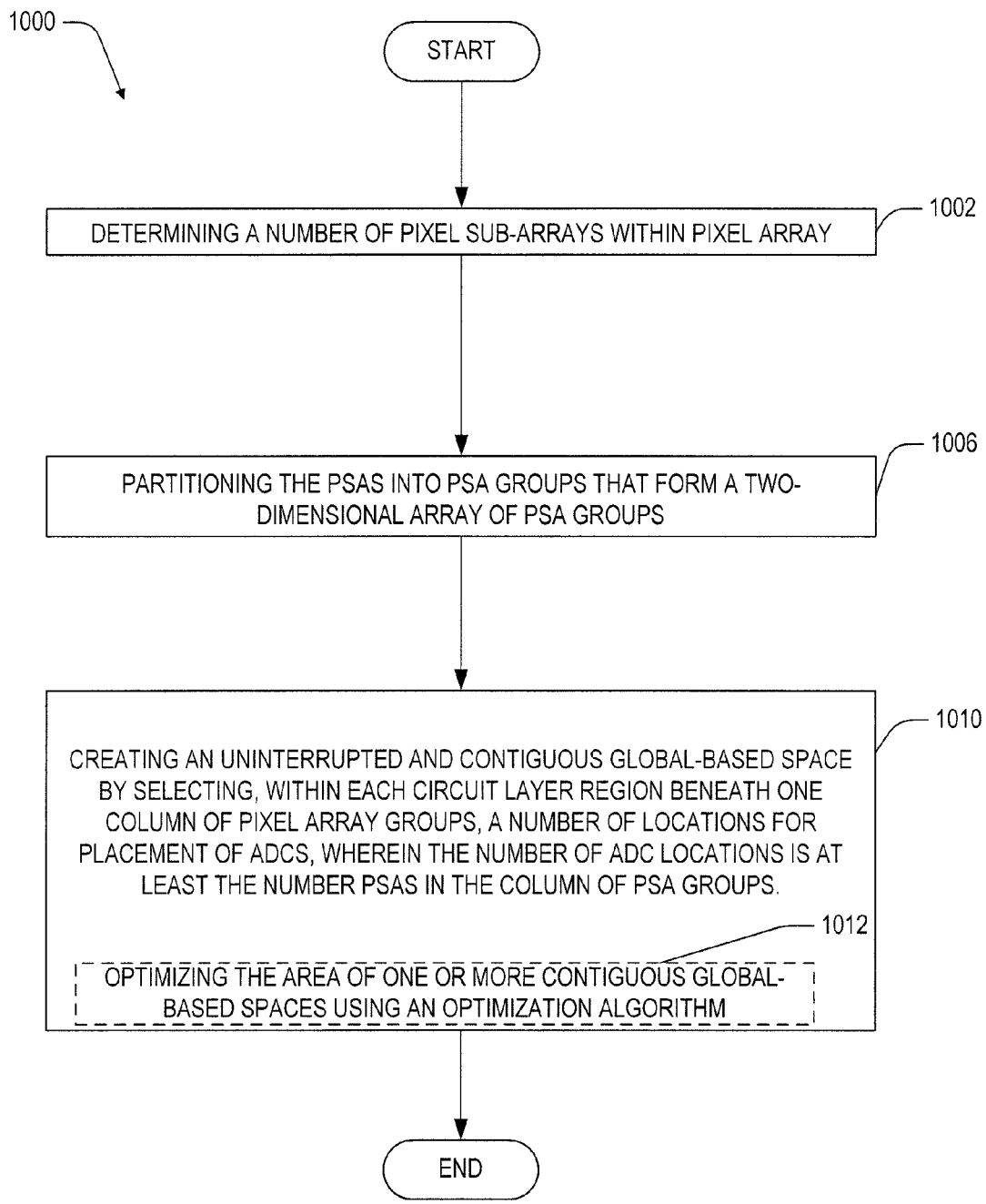
FIG. 10 is a flowchart illustrating one exemplary method for optimizing a floorplan of the stacked image sensor of FIG. 1.

FIG. 10 is a flowchart illustrating one exemplary method 1000 for optimizing a floorplan of stacked image sensor 100. Method 1000 is, for example, implemented in software 920 within ADC floorplan generator 900 of FIG. 9.

In step 1002, method 1000 determines the number of PSAs within the pixel array. In one example of step 1002, ADC floorplan generator 900 receives an input from a user input device 918 indicating the number of PSAs within the pixel array.

In step 1006, method 1000 partitions the PSAs into distinct, non-overlapping, and contiguous PSA groups that form a two-dimensional array of PSA groups. In an example of step 1006, the number of PSA groups is an integer divisor of the number of PSAs, which results in an equal number of PSAs in each PSA group. In one example of step 1006, processor 902 executes instructions of PSA partitioning algorithm 906 to partition the PSAs.

In step 1010, method 1000 creates an uninterrupted and contiguous global-based space by selecting, for each circuit-layer column, a number of locations for placements of ADCs, wherein the number of areas is at least the number PSAs in each column of PSA groups. The result is ADC floorplan 950.

In one example of step 1010, processor 902 executes instructions of ADC layout algorithm 912 to select areas on the circuit layer reserved for an ADC. ADC layout algorithm 912 receives floorplan constraints 936, which limits the maximum number of adjacent ADCs per circuit-layer column to four and requires four contiguous global-based spaces on the circuit layer. A result of such floorplan constraints is circuit layer 109 with the ADC arrangement of circuit layer 509. A floorplan constraint limiting the number of contiguous global-based spaces to one may result in circuit layer 109 with the ADC arrangement of circuit layer 709. A floorplan constraint limiting the number of contiguous global-based spaces to two may result in circuit layer 109 with the ADC arrangement of circuit layer 809.

In one embodiment, method 1000 includes an optional step 1012. If included, in step 1012, method 1000 optimizes the area of one or more contiguous global-based spaces using a mathematical optimization algorithm. In an example of step 1012, processor 902 executes instructions of optimization algorithm 916 that contains a merit function related to the area of one or multiple contiguous global-based spaces on the circuit layer.

The order of steps within method 1000 may be changed without departing from the scope hereof.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A floorplan-optimized stacked image sensor, comprising:
    a sensor layer having a plurality of pixel sub-arrays (PSAs) that form a contiguous two-dimensional pixel array;
    a circuit layer having a local-based space, with a plurality of analog-to-digital converters (ADCs) thereon each communicatively coupled to a different one of the plurality of PSAs, interleaved with at least one contiguous global-based space of the circuit layer that is uninterrupted by any of the ADCs;
    in a direction parallel to rows of the pixel array, a first spatial dimension of the at least one global-based space exceeds a first spatial dimension of a PSA, and
    in a direction parallel to columns of the pixel array, a second spatial dimension of the global-based space exceeds a second spatial dimension of the PSA.

2. The floorplan-optimized stacked image sensor of claim 1, wherein each ADC is beneath the PSA to which it is communicatively coupled.

3. The floorplan-optimized stacked image sensor of claim 2, at least one of the ADCs being entirely beneath the PSA to which it is communicatively coupled.

4. The floorplan-optimized stacked image sensor of claim 1, wherein at least part of each ADC is beneath each PSA of a PSA group comprising two or more adjacent PSAs.

5. The floorplan-optimized stacked image sensor of claim 4, wherein the PSA groups are contiguous, non-overlapping, and distinct.

6. The floorplan-optimized stacked image sensor of claim 4, one ADC being positioned beneath one of the plurality of PSA groups other than the PSA group that includes the PSA to which the ADC is communicatively coupled, such that an area of the at least one contiguous global-based space is increased.

7. The floorplan-optimized stacked image sensor of claim 6, wherein a region on the circuit layer congruent to and beneath one PSA is entirely global-based space.

8. A method for optimizing the floorplan of a stacked image sensor having a circuit layer with a plurality of analog-to-digital converters (ADCs), each ADC communicatively coupled to a different one of a plurality of pixel sub-arrays (PSAs) arranged to form a contiguous two-dimensional pixel array on a sensor layer positioned above the circuit layer, comprising:
    determining a number of PSAs within the contiguous two-dimensional pixel array;
    partitioning the PSAs into PSA groups that form a two-dimensional array of PSA groups;
    forming an uninterrupted and contiguous global-based space by selecting, within each circuit layer region beneath one column of PSA groups, a number of locations for placement of ADCs, wherein the number of ADC locations is at least the number PSAs in the column of PSA groups;
    wherein:
        in a direction parallel to rows of the pixel array, a first spatial dimension of the at least one global-based space exceeds a first spatial dimension of a PSA, and
        in a direction parallel to columns of the pixel array, a second spatial dimension of the global-based space exceeds a second spatial dimension of the PSA.

9. The method of claim 8, wherein the step of partitioning includes partitioning the PSAs so that the PSA groups are distinct, non-overlapping, and contiguous.

10. The method of claim 8, wherein the step of partitioning includes partitioning the PSAs into an integer divisor of the number of PSA groups.

11. The method of claim 8, further comprising determining a number of distinct global-based spaces on the circuit layer.

12. The method of claim 8, further comprising determining ADC spatial dimensions so that the number of ADCs that fit entirely beneath a PSA group exceeds the number of PSAs in the PSA group.

13. The method of claim 8, further comprising determining floorplan constraints.

14. The method of claim 8, wherein the step of forming includes maximizing the uninterrupted and contiguous global-based space.

15. The method of claim 8, wherein the step of forming further comprises optimizing the area of one or more contiguous global-based spaces using a mathematical optimization algorithm.

16. A floorplan-optimized stacked image sensor, comprising:
    a sensor layer having a plurality of pixel sub-arrays (PSAs) that form a contiguous two-dimensional pixel array, each PSA belonging to one of a plurality of contiguous, non-overlapping, and distinct PSA groups formed of two or more adjacent PSAs;
    a circuit layer having a local-based space, with a plurality of ADCs thereon, interleaved with at least one contiguous global-based space of the circuit layer that is uninterrupted by any of the ADCs;
    each PSA communicatively coupling with a different one of the plurality of ADCs;
    the number of ADCs being positioned beneath any one column of PSA groups is at least the number of PSAs within the one column;
    each of the plurality of ADCs being beneath each PSA of a corresponding one of the plurality of PSA groups and;
    each ADC being positioned beneath the PSA to which it is communicatively coupled.

17. The floorplan-optimized stacked image sensor of claim 16, the number of global-based spaces being equal to one-half the number of PSA groups in one column of PSA groups.

18. The floorplan-optimized stacked image sensor of claim 16, at least one of the ADCs being entirely beneath the PSA to which it is communicatively coupled.

19. A floorplan-optimized stacked image sensor, comprising:
    a sensor layer having a plurality of pixel sub-arrays (PSAs) that form a contiguous two-dimensional pixel array, each PSA belonging to one of a plurality of contiguous, non-overlapping, and distinct PSA groups formed of two or more adjacent PSAs;

a circuit layer having a local-based space, having a plurality of ADCs therein, interleaved with a contiguous global-based space uninterrupted by any of the ADCs;

each PSA communicatively coupling with a different one of the plurality of ADCs;

the number of ADCs beneath one PSA group exceeding the number of PSAs in the one PSA group;

the number of ADCs beneath any one column of PSA groups being at least the number of PSAs in the one column;

a portion of each of the plurality of ADCs being beneath each PSA that constitutes a PSA group;

one ADC being positioned beneath one of the plurality of PSA groups other than the PSA group that includes the PSA that the one ADC communicatively couples to such that the area of global-based space is increased; and a first ADC being communicatively coupled to a first PSA, of the plurality of PSAs, and positioned such that no portion of the first ADC is directly beneath any portion of the first PSA;

a region on the circuit layer congruent to and beneath one PSA being entirely global-based space; and two orthogonal dimensions of global-based space exceeding, respectively, two orthogonal dimensions of one PSA of the plurality of PSAs.

20. The floorplan-optimized stacked image sensor claim 19, at least one of the ADCs being entirely beneath the PSA to which it is communicatively coupled.

* * * * *